(12) United States Patent
Takahashi et al.

(10) Patent No.: US 8,405,205 B2
(45) Date of Patent: Mar. 26, 2013

(54) POWER SEMICONDUCTOR MODULE

(75) Inventors: Kiyoshi Takahashi, Hino (JP); Souichi Okita, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/067,607

(22) Filed: Jun. 14, 2011

(65) Prior Publication Data

US 2012/0001227 A1 Jan. 5, 2012

(30) Foreign Application Priority Data

Jun. 18, 2010 (JP) ................................ 2010-139731

(51) Int. Cl.
*H01L 29/739* (2006.01)
(52) U.S. Cl. ................................ 257/724; 257/E29.197
(58) Field of Classification Search .................. 257/724, 257/E29.197, E23.116
See application file for complete search history.

(56) References Cited

U.S. PATENT DOCUMENTS

| | | | | | |
|---|---|---|---|---|---|
| 4,970,576 A | * | 11/1990 | Neidig et al. | ................. | 257/701 |
| 5,967,858 A | * | 10/1999 | Yamada | ........................ | 439/736 |
| 2006/0126312 A1 | * | 6/2006 | Kroneder | ...................... | 361/752 |
| 2010/0039843 A1 | * | 2/2010 | Takizawa | ....................... | 363/131 |
| 2011/0273861 A1 | * | 11/2011 | Matsumoto et al. | ........... | 361/820 |

FOREIGN PATENT DOCUMENTS

| JP | 2003-046035 | 2/2003 |
|---|---|---|
| JP | 2008-193779 | 8/2008 |

* cited by examiner

*Primary Examiner* — Colleen Matthews
(74) *Attorney, Agent, or Firm* — Manabu Kanesaka

(57) ABSTRACT

A power semiconductor module includes a plurality of sets of semiconductor switching elements, a molded resin casing containing the semiconductor switching elements, screw holders for receiving mounting screws formed at bottom regions of four corners of the molded resin casing, first terminal blocks having main circuit terminals, and arranged on a central region of a top surface of the molded resin casing, and second terminal blocks having control terminals arranged at a side edge of the molded resin casing apart. Insulating separation walls having a configuration of a rib erect from a surface of the second terminal blocks, and are interposed between groups of the control terminals corresponding to the sets of semiconductor switching elements, and between the screw holder including the mounting screw therein on the molded resin casing and the control terminal at a high voltage side adjacent to the screw holder.

5 Claims, 5 Drawing Sheets

POWER SEMICONDUCTOR MODULE

CROSS-REFERENCE TO RELATED APPLICATION

The present application claims priority to Japanese Patent Application number 2010-139731 filed on Jun. 18, 2010, which is incorporated by reference in its entirety.

BACKGROUND OF THE INVENTION

1. Field of the Invention

The present invention relates to a semiconductor module directed to an IGBT module of a power conversion apparatus for application to a power supply in rolling stocks and the like. The invention relates particularly to an insulation structure of a control terminal block formed on a molded resin casing of the module.

2. Description of the Related Art

Recently, the power conversion apparatuses described above employ a three-level PWM inverter in many cases. Patent Document 1 discloses a three-level IGBT module for application to such an inverter device; the module is a four-in-one type IGBT module containing four sets of semiconductor switching elements each comprising an anti-parallel-connected IGBT and FWD, and integrated in one package in a molded resin casing. The patent application of Patent Document 1 was done by the same applicant as that of the present patent application to the Japanese Patent Office.

FIGS. 4 through 7 show an example of conventional construction of a single phase inverter unit (that is a general purpose inverter unit and not dedicated to rolling stocks) employing such four-in-one type power semiconductor module as disclosed in Patent Document 1. FIG. 4 shows a whole assembled inverter unit; FIG. 5 is an external perspective view of an IGBT module that is a power semiconductor module for one phase (U-phase) of the inverter unit; FIG. 6 is a plan view of the IGBT module of FIG. 5; and FIG. 7 is a circuit diagram of the module.

Referring to FIG. 4, the reference numeral 1 shows an IGBT module, the reference numeral 2 shows a heat sink (cooling fins), the reference numeral 3 shows a laminated bus bar composing a circuit board of the unit, and reference numeral 4 shows a smoothing capacitor of a DC power supply connecting to the input side of the IGBT module 1. The IGBT module 1 contains four switching elements T1 through T4 indicated in the circuit diagram of FIG. 7 housed in the molded resin casing 5 of a box type with a rectangular planar configuration (see FIG. 5 and FIG. 6). Main circuit terminals 7 drawn out from the switching elements T1 through T4 are arranged in a row on protruding terminal block 5a formed on the central region of a top surface of the molded resin casing 5. Control terminals 8 drawn out from the switching elements are arranged in a row on a terminal block 5b formed at a side edge (in a shorter side) of the molded resin casing 5. The reference numeral 5c shows a screw holder for a-mounting screw formed at four corners of the molded resin casing 5; the reference numeral 5c-1 shows a metal sleeve inserted in a screw hole of the screw holder 5c; and the reference numeral 6 shows a metal base plate disposed on the bottom surface of the molded resin casing 5. The IGBT module 1 is fixed to the heat sink 2 (see FIG. 4) with mounting screws 9 inserted through the screw holder 5c.

FIG. 7 illustrates an internal circuit diagram of the IGBT module. Referring to FIG. 7, each set of the four switching elements T1 through T4 has an IGBT and a FWD in anti-parallel connection. A pair of the switching elements T1 and T2 is connected in series between a positive terminal P and a negative terminal N of a DC power supply and forms an upper arm and a lower arm of a one phase of an inverter unit. Another pair of the other switching elements T3 and T4 is connected in anti-series connection and connecting to an AC output terminal U and the neutral terminal M of the DC power supply forming a bidirectional switching circuit. Operation of the three-level IGBT module is described in detail in Patent Document 1 so it is not described here.

FIG. 7 indicates symbols of terminals 'T1 G', 'T1/T4 E', 'T2 G', 'T2 E', 'T3 G', 'T3 E', 'T4 G', 'T4 E', and 'C', which are control terminals (sensing terminals) drawn out corresponding to the sets of switching elements T1 through T4. The symbols of terminals are indicated corresponding to FIG. 7 at the main circuit terminals 7 and the control terminals 8 in FIG. 6. In actual products, the symbols of terminals are indicated by stamping at the sides of corresponding terminals 7 and 8 on the top surface of the molded resin casing 5.

Meanwhile, there are guidelines for electric insulation of the power IGBT module: a domestic regulation according to JEM standards (Standards of The Japan Electrical Manufacturers' Association) and an international regulation according to IEC standards (Standards of the International Electro technical Commission). These standards specify a creepage distance and a clearance for electric insulation corresponding to the operational environment and the working voltage of the semiconductor module. For devices including an IGBT module for application to rolling stocks in particular, the annex of the International Standard IEC 60077-1 (Railway applications—Electric equipment for rolling stock) specifies insulation distances (the creepage distance and the clearance) corresponding to an overhead line voltage and degree of contamination of the operation environment.

If no restriction is imposed on the external size of the module, the required insulation distance can be ensured without problem between a terminal of the main circuit terminals 7 and the control terminals 8 disposed on the top surface of the molded resin casing 5 in FIGS. 5 and 6 and the metal base plate 6, and between the terminal and the mounting screw 9 (which is at the ground frame potential); and also between any two of the terminals, by simply enlarging the size of the module itself.

When reduction of the size or thickness of the module is desired, however, it is difficult to ensure a required creepage distance and a clearance with a flat insulation plane of the casing top surface alone because of the limitation of the external size. The control terminals 8 in particular, which are drawn out from the switching elements T1 through T4 and arranged in a row on the terminal block 5b of the molded resin casing 5, can hardly ensure the required insulation distance with a configuration as it is, because a gap between the terminals is narrow, and the terminals are located in the proximity of the mounting screws 9 at the ground frame potential in the both sides of the terminal block 5b.

In order to cope with this insulation problem, Patent Document 2 discloses a module packaging structure in which electrically insulating separation walls (barriers) are formed standing at the periphery of a molded resin casing surrounding main circuit terminals and control terminals disposed on the casing top surface, thereby ensuring the required creepage distance and the clearance from the terminals to a metal base plate and mounting screws disposed on the bottom region of the casing.

In view of the background, the inventors of the present invention fabricated a package structure and studied the insulation performance thereof. The fabricated package structure is basically similar to that of the module shown in FIGS. 5 and 6, and has an enhanced insulation distance between the control terminals 8 and the ground frame potential components of metal base plate 6 and mounting screws 9, and between the control terminals. This enhancement of insulation distance was intended to be achieved, as shown in FIG. 8, by forming peripheral walls 5b-1 standing surrounding the control terminals 8 corresponding to the switching elements T1 through T4 around the terminal block 5b at the side edge of the casing having the control terminals 8.

[Patent Document 1] Japanese Unexamined Patent Application Publication No. 2008-193779
[Patent. Document 2] Japanese Patent No. 3705755

The IGBT module of FIG. 8 as described above, though exhibiting an enhanced insulation performance for the control terminals 8 as compared with the conventional structure of FIG. 5 and FIG. 6, has been found to involve the following new problems with regard to application to an auxiliary power supply for rolling stocks of DC 750 V input.

(1) The insulating separation walls 5b-1 encircling the control terminals 8 and surrounding the entire periphery of the terminal block 5b provided at the side edge of the molded resin casing 5 decreases a space for indicating the symbols of the control terminals to be stamped on the terminal block surface which is shrunk due to the thickness of the newly formed surrounding walls of the insulating separation walls 5b-1. As a consequence, the letters for indicating the symbols of terminals must be made smaller and in addition, the surrounding walls obstruct visual recognition of the terminal symbols. Thus, any erroneous wiring may occur in the wiring work of the inverter unit. If the terminal block 5b is expanded preferring obtaining sufficient space for indicating the terminal symbols on the other hand, the external dimensions of the molded resin casing 5 increases, suppressing an area for packaging the IGBT module.

(2) The standards of the IEC 60077-1 (The Standards for rolling stocks) specifies the minimum width (x) of a groove formed on a surface of a molded resin casing to be 2.5 mm. A gap or groove less than this width is not regarded as a creepage distance. Moreover, a creepage distance between an electrically conductive part and a ground potential metal must be at least 16 mm in a device of an insulation voltage of 1,000 V class. As a consequence, when a clearance of at least 2.5 mm is contemplated, which is the minimum width (x) according to the standards above-mentioned between every control terminal 8 disposed on the terminal block 5b and the surrounding insulating separation walls 5b-1, the external size of the molded resin casing 5 must increase and enlarges the module size, which is another problem.

SUMMARY OF THE INVENTION

The present invention has been made in view of the above problems and it is an object of the present invention to provide a power semiconductor module with an improved insulation structure of the control terminal part to achieve a small sized and compacted module and application to rolling stocks. This improvement has been accomplished after reviewing a conventional structure of the terminal block formed at the side edge of the molded resin casing and arranging the control terminals in consideration of the result of the above-mentioned study by the inventors.

In order to accomplish the above objects, a power semiconductor module according to the first aspect of the present invention comprises a plurality of sets of semiconductor switching elements and a molded resin casing of a box type containing the plurality of sets of semiconductor switching elements. The molded resin casing comprises screw holders for receiving a mounting screw formed at bottom regions of four corners of the molded resin casing and terminal blocks formed on a central region of a top surface of the molded resin casing. Main circuit terminals are arranged on the terminal block. Second terminal blocks are arranged at on the side edge of the resin casing, spaced from the main circuit terminals. Control terminals drawn out from the sets of semiconductor switching elements are arranged in a row on the second terminal blocks at the side edge of the resin casing.

Insulating separation walls of a configuration of rib stands up from the surface of the terminal block for control terminals and interposed between groups of control terminals corresponding to the sets of semiconductor switching elements and between the screw holder with a mounting screw therein on the molded resin casing and a control terminal at a high voltage side adjacent to the screw holder.

Here, in the second aspect, the insulating separation walls formed on the terminal block for control terminals at the side edge of the molded resin casing have dimensions of height and thickness that are determined in accordance with a clearance and a creepage distance specified in the international standards IEC 60077-1.

Preferably, in the third aspect, the power semiconductor module is a three-level IGBT module of a four-in-one type installed in the molded resin casing, using four sets of semiconductor switching elements, each set having an anti-parallel-connected IGBT and a FWD. The power semiconductor module comprises an upper arm and a lower arm composing one phase of an inverter circuit connecting to positive and negative terminals of a DC power supply between the positive and negative terminals; and a bidirectional switching circuit connecting to an AC output terminal of the inverter circuit and a neutral terminal of the DC power supply between the AC output terminal and the neutral terminal.

With the above-described construction, by adding insulating separation walls with a simple rib configuration on the terminal block for the control terminals, a small sized and compacted three-level power semiconductor module that ensures the insulation distance prescribed in the international standards for rolling stocks IEC 60077-1 could be provided. Moreover, the symbols of the control terminals stamped on the surface of the terminal block are more readily recognized visually, and thus, wiring work of the module is more easily conducted.

BRIEF DESCRIPTION OF DRAWINGS

FIGS. 3(a), 3(b), and 3(c) are enlarged views of essential parts of the power semiconductor module of FIGS. 1 and 2, in which FIG. 3(a) is a plan view, and FIGS. 3(b) and 3(c) are perspective views from different directions;

DETAILED DESCRIPTION OF THE INVENTION

Figure 5:
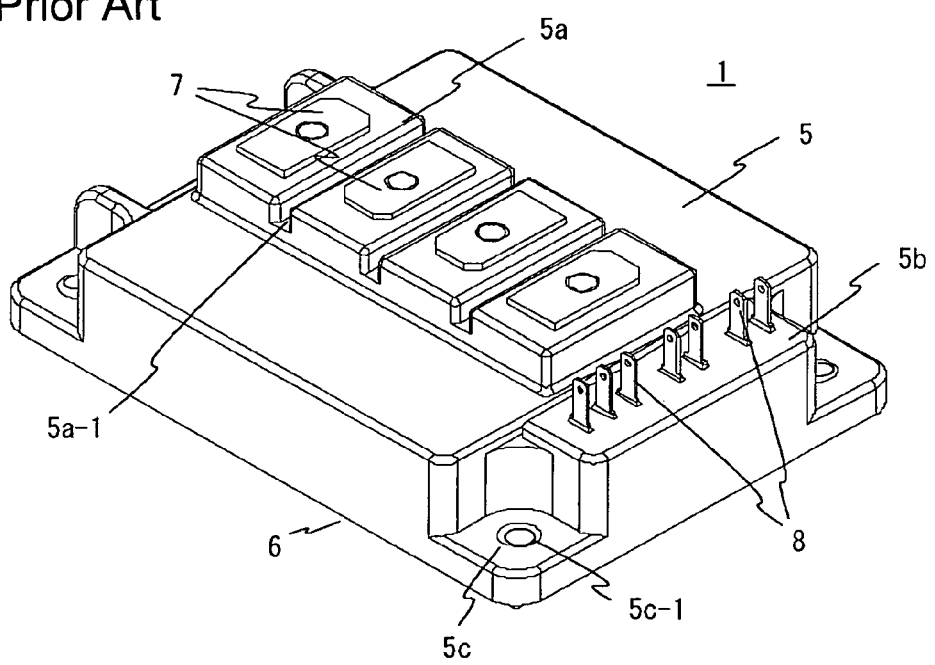
FIG. 5 is an external perspective view showing a conventional structure of a four-in-one type IGBT module installed in a unit of FIG. 4.

Preferred embodiments of a power semiconductor module according to the present invention will be described in the following with reference to FIGS. 1 through 3. The members shown in the FIGS. 1 through 3 similar to those in FIGS. 5 and 6 are given the same symbol.

Figure 1:
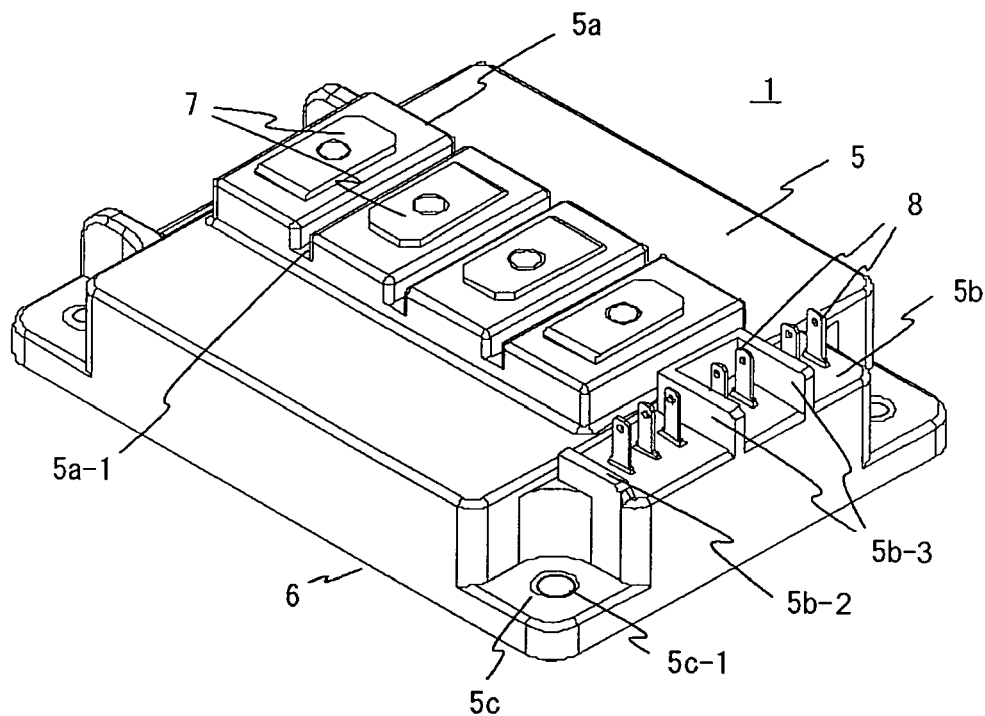
FIG. 1 is a perspective view of a construction of a power semiconductor module of an embodiment according to the present invention.
Figure 2:
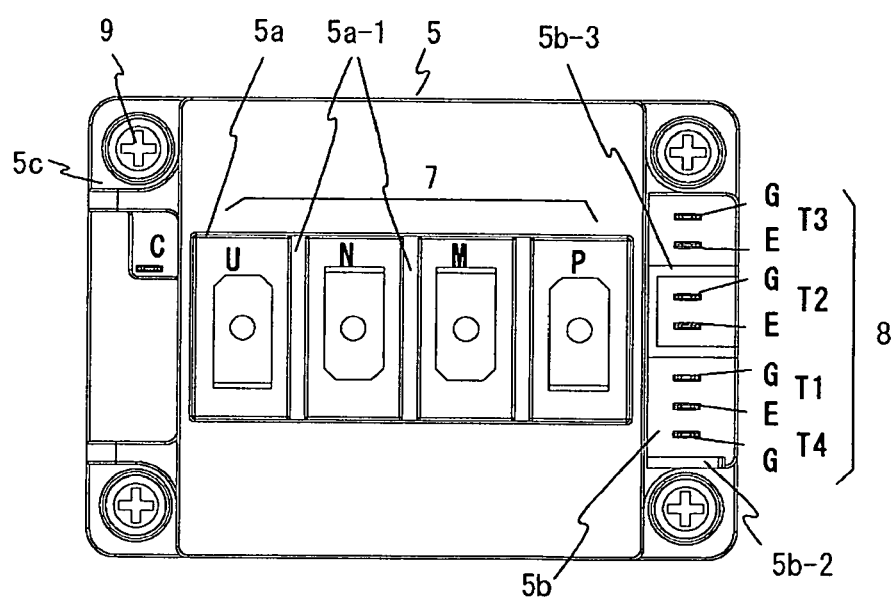
FIG. 2 is a plan view of the power semiconductor module of FIG. 1.
Figure 3A:
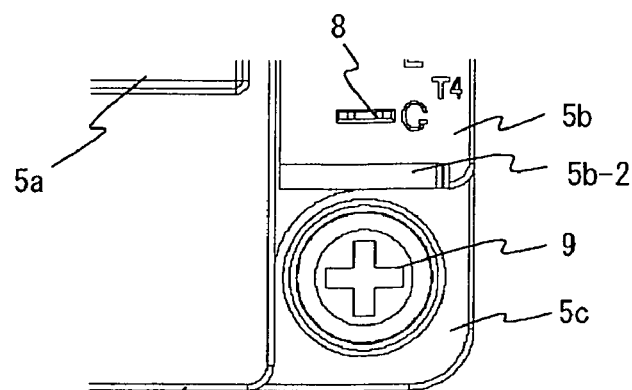
Figure 6:
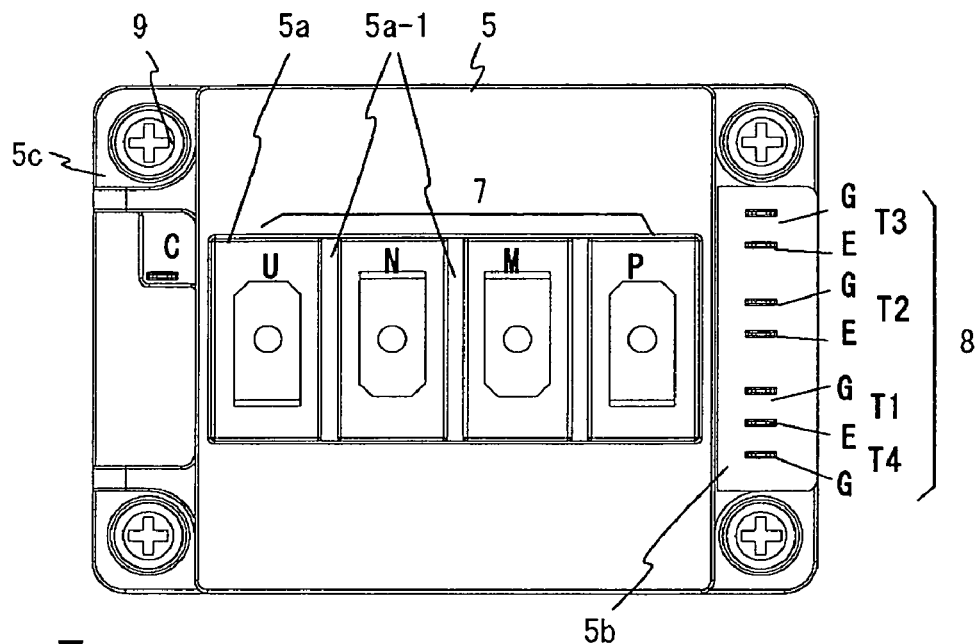
FIG. 6 is a plan view of the module of FIG. 5.
Figure 7:
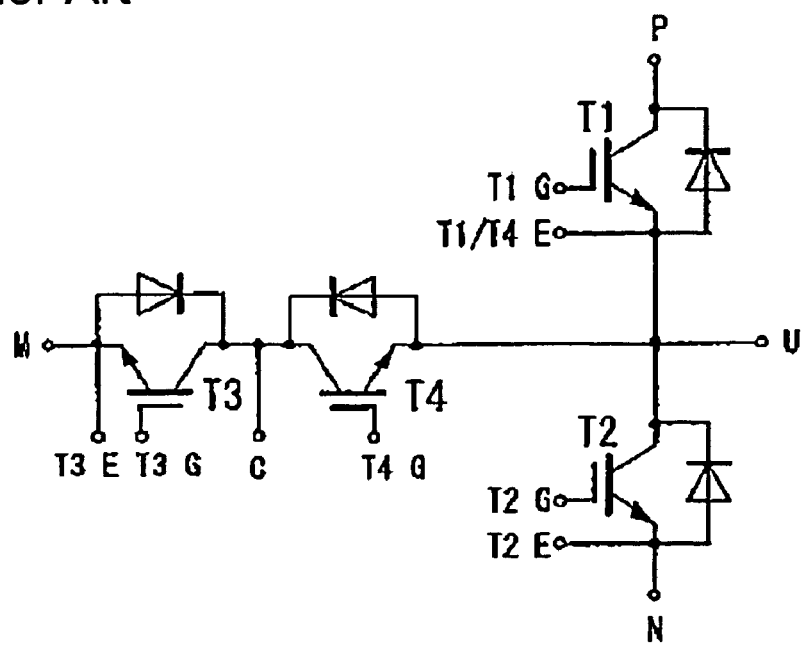
FIG. 7 is an internal circuit diagram of the module of FIG. 5.

In the embodiment example shown in FIGS. 1 through 3, control terminals 8 of gates and emitters corresponding to the semiconductor switching elements T1 through T4 shown in FIG. 7 are disposed on a terminal block 5b formed along the side edge at the shorter side of a molded resin casing 5 in the same arrangement as in the conventional structure of FIG. 6. Control terminals at the both ends oppose mounting screws 9 inserted in the screw holder 5c. The control terminals 8 in this arrangement are subject to the voltages as follows, which can be understood with the circuit diagram of FIG. 7.

The operating voltage difference between the gate terminal (G) and the emitter terminal (E) of the semiconductor switching elements T1 through T4 is several tens of volts. However, an operation voltage equivalent to the full voltage of the power supply (for example, 900 V at the maximum) is applied between the gate terminal (G) of the switching element T4 and the mounting screw 9 (which is at the ground frame potential), and between the gate terminal (G) of the switching element T1 and the emitter terminal (E) of the switching element T2 adjacent to this gate terminal (G) of the switching element T1. An operation voltage equivalent to the half voltage of the power supply (for example, 450 V at the maximum) is applied between the gate terminal (G) of the switching element T2 and the emitter terminal (E) of the switching element T3, and between the gate terminal (G) of the switching element T3 and the mounting screw 9 opposing to this gate terminal.

In the embodiment example shown in FIGS. 1 through 3, based on the distribution of voltages applied between the control terminals 8, insulating separation walls 5b-2 and 5b-3 are formed standing on the terminal block 5b as shown in FIGS. 1 through 3 to enhance insulation performance. The insulating separation wall 5b-2 is a protruding wall in a configuration of a rib formed standing along the side edge of the terminal block 5b interposed perpendicularly between the gate terminal (G) of the switching element T4 and the mounting screw 9 opposing the gate terminal disposed across the vertically stepped place. On the other hand, the insulating separation wall 5b-3 is a wall in a shape of the letter U formed standing and interposed between a group comprising the emitter terminal (E) and the gate terminal (G) of the switching element T2, the gate terminal of the switching element T1 adjacent to the group, and between the group and the emitter terminal (E) of the switching element T3 adjacent to the group. The extreme outer edge side of the wall 5b-3 is opened and no wall exists here to form the letter U as shown in FIGS. 1 and 2. At the edge of the terminal block opposite to the side of the insulating separation wall 5b-2, no insulating separation wall is provided. Because the voltage applied to the gate terminal (G) of the switching element T3 with respect to the mounting screw 9 is half the voltage applied to the gate terminal (G) of the switching element T4 with respect to the mounting screw 9, the required insulation strength can be attained without an insulating separation wall at this position.

Figure 3B:
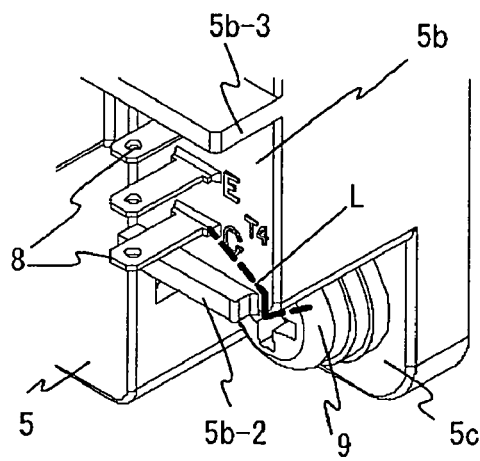
Figure 3C:
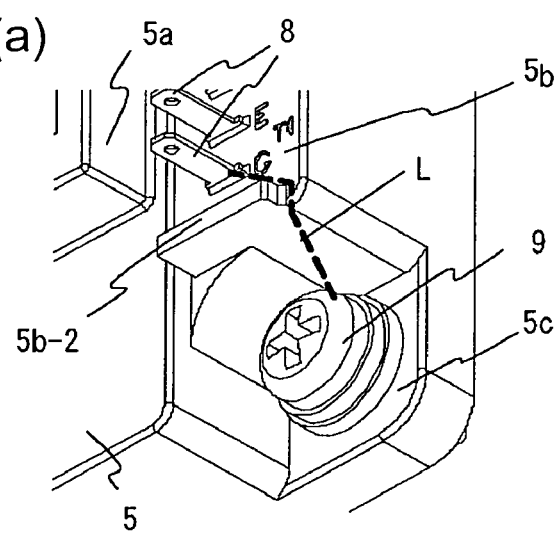
Figure 4:
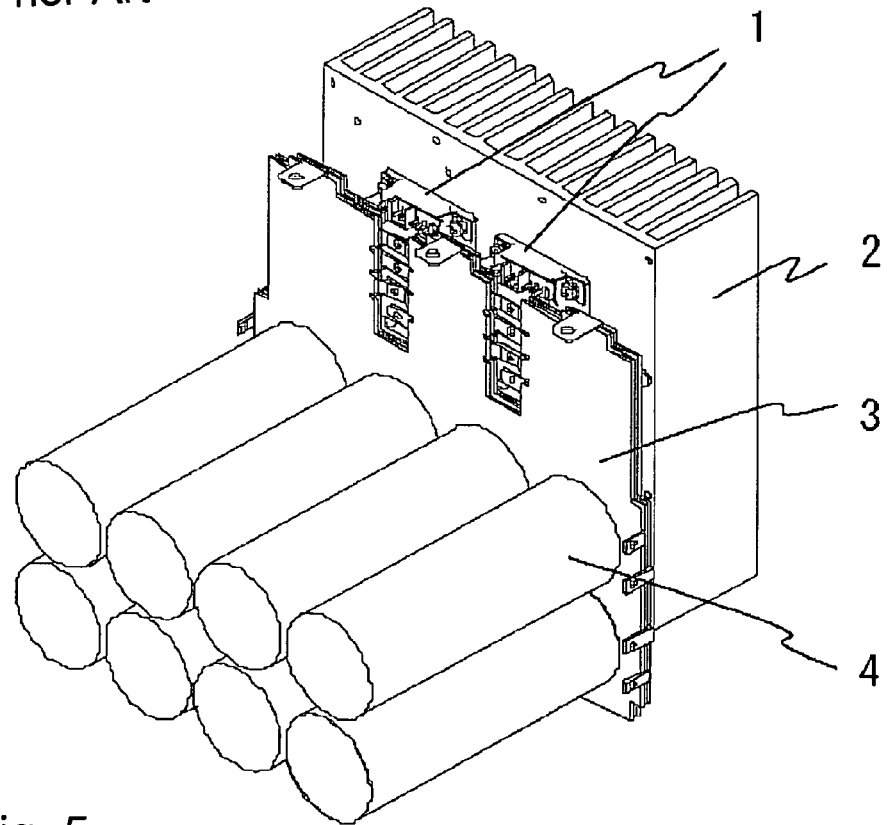
FIG. 4 shows an assembled structure of an inverter unit constructed with a three-level IGBT module.

In addition to the provision of the insulating separation walls 5b-2 and 5b-3, the structure of the embodiment shown in FIGS. 1 through 3 has dimensional features in order to ensure insulation distances, a clearance and a creepage distance, in accordance with the IEC 60077-1 Standards. The insulating separation wall 5b-2 has a thickness and a height of at least 2.5 mm, and the insulating separation wall 5b-3 has a thickness of at least 2.5 mm and a height of at least 5 mm. Further, a gap between the insulating separation wall 5b-2 and the control terminal 8 that is adjacent to this wall is at least 2.5 mm and a gap between the insulating separation wall 5b-3 and the control terminal 8 that is adjacent to this wall is at least 2.5 mm. In these dimensions, a creepage distance of at least 16 mm which is the minimum creepage distance specified in the Standards is attained between the mounting screw 9 and the gate terminal (G) of the switching element T4 in the high voltage side and nearest to the mounting screw 9 as indicated by the dotted line L in FIGS. 3(b) and 3(c). In the embodiment example of FIGS. 1 through 3, the terminal block 5a for the main circuit terminals 7 formed on the central region of the upper surface of the molded resin casing 5 has grooves 5a-1 between the terminals. The groove has a width of at least 2.5 mm.

Figure 8:
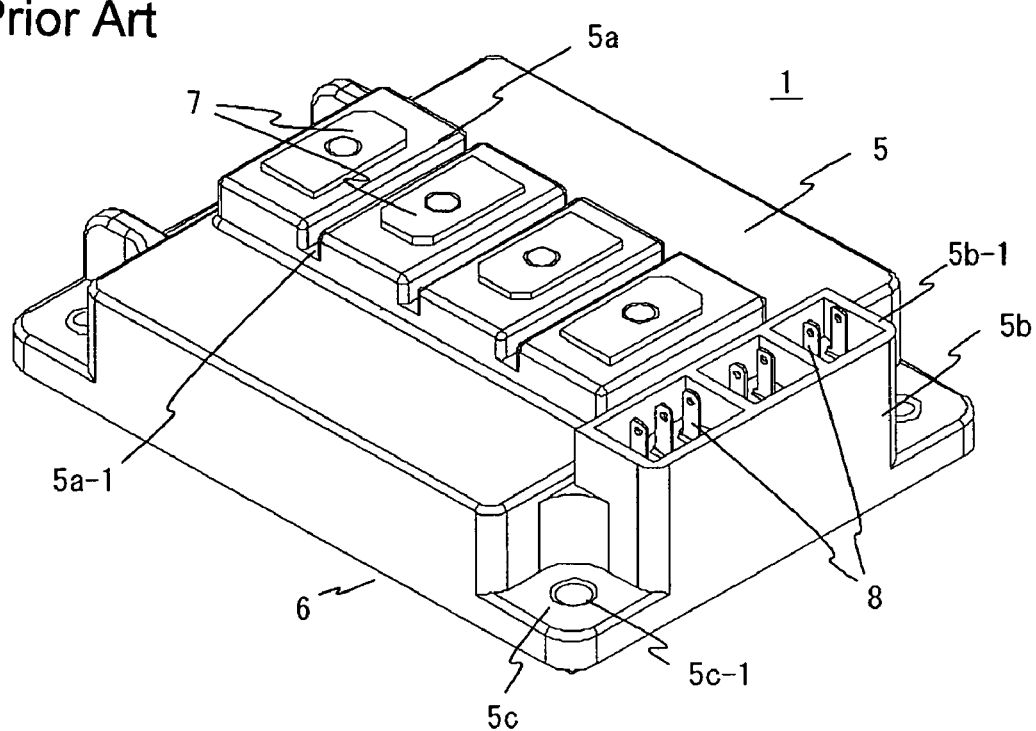
FIG. 8 is an external perspective view of a conventional structure, in which insulating separation walls are additionally provided surrounding the entire periphery of the control terminals on the terminal block of the molded resin casing of the module of FIG. 5.

As described above, the terminal block 5b formed on the molded resin casing 5 of the IGBT module 1 is additionally provided with the insulating separation wall 5b-2 between the mounting screw and the control terminal and the insulating separation wall 5b-3 between the groups of control terminals. The insulating separation walls have a height, thickness, and a distance to the terminals as descried above. Therefore, a small sized and compacted module can be designed while ensuring the insulation strength according to the international standards for rolling stocks IEC 60077-1. The insulating separation walls formed on the terminal block 5b having the control terminals 8 thereon do not completely surround the control terminals like in the conventional structure shown in FIG. 8, but are opening towards the side edge of the casing 5 as shown in FIG. 1. Therefore, the symbols of the terminals are stamped at positions that allow easy visual recognition without limiting the indicating space.

What is claimed is:

1. A power semiconductor module, comprising:
   a plurality of sets of semiconductor switching elements;
   a molded resin casing with a box shape containing the plurality of sets of semiconductor switching elements;
   screw holders for receiving mounting screws, formed at bottom regions of four corners of the molded resin casing;
   first terminal blocks having main circuit terminals, and arranged on a central region of a top surface of the molded resin casing;
   second terminal blocks having control terminals arranged in a row at a side edge of the molded resin casing apart from the first terminal blocks and drawn out from the sets of the semiconductor switching elements; and
   insulating separation walls having a first rib erecting from a surface of the second terminal blocks for the control terminals and surrounding a middle control terminal among groups of the control terminals corresponding to the sets of semiconductor switching elements, and a second rib in a plate shape between the screw holder including the mounting screw therein on the molded resin casing and the control terminal at a high voltage side adjacent to the screw holder,
   wherein the first rib has three side walls in a U-shape with one open side at an outer edge side of the second terminal block.

2. The power semiconductor module according to claim 1, wherein the insulating separation walls formed on the second terminal block for the control terminals at the side edge of the molded resin casing have dimensions with height and thickness that are determined in accordance with a clearance and a creepage distance specified in the international standards IEC 60077-1.

3. The power semiconductor module according to claim 1, wherein the power semiconductor module is a three-level IGBT module of a four-in-one type including four sets of semiconductor switching elements installed in the molded resin casing, where an IGBT and a FWD are anti-parallel-connected; and the IGBT module comprises an upper arm and a lower arm composing one phase of an inverter circuit connected between positive and negative terminals of a DC power supply; and a bidirectional switching circuit connected between an AC output terminal of the inverter circuit and a neutral terminal of the DC power supply.

4. The power semiconductor module according to claim 3, wherein the second rib has a height less than that of the first rib.

5. The power semiconductor module according to claim 4, wherein the second terminal block includes three control terminals, the first rib surrounding a middle control terminal among the three control terminals, and the second rib at one side of the three control terminal, with no rib at a side opposite to the second rib.

* * * * *